(12) United States Patent
Nal et al.

(10) Patent No.: US 9,777,374 B2
(45) Date of Patent: Oct. 3, 2017

(54) CHEMICAL VAPOR DEPOSITION DEVICE

(71) Applicant: Altatech Semiconductor, Montbonnot-Saint-Martin (FR)

(72) Inventors: Patrice Nal, Grenoble (FR); Christophe Borean, Le Touvet (FR); Julien Vitiello, Grenoble (FR)

(73) Assignee: ALTATECH SEMICONDUCTOR, Montbonnot-Saint-Martin (FR)

( * ) Notice: Subject to any disclaimer, the term of this patent is extended or adjusted under 35 U.S.C. 154(b) by 208 days.

(21) Appl. No.: 14/769,414

(22) PCT Filed: Feb. 21, 2014

(86) PCT No.: PCT/EP2014/053457
§ 371 (c)(1),
(2) Date: Aug. 20, 2015

(87) PCT Pub. No.: WO2014/128267
PCT Pub. Date: Aug. 28, 2014

(65) Prior Publication Data
US 2016/0002788 A1    Jan. 7, 2016

(30) Foreign Application Priority Data

Feb. 21, 2013 (FR) ..................... 13 51526

(51) Int. Cl.
*C23C 16/455* (2006.01)
*C23C 16/44* (2006.01)

(52) U.S. Cl.
CPC .... *C23C 16/45572* (2013.01); *C23C 16/4401* (2013.01); *C23C 16/4408* (2013.01); *C23C 16/4558* (2013.01); *C23C 16/45504* (2013.01); *C23C 16/45517* (2013.01); *C23C 16/45521* (2013.01)

(58) Field of Classification Search
CPC .......... C23C 16/45572; C23C 16/4558; C23C 16/4408; C23C 16/4401; C23C 16/45504; C23C 16/45517; C23C 16/45521
USPC ........................................ 118/715; 156/345.1
See application file for complete search history.

(56) References Cited

U.S. PATENT DOCUMENTS 6,159,299 A    12/2000  Koai et al.
2005/0170090 A1   8/2005  Tanaka

FOREIGN PATENT DOCUMENTS

DE    4417626 A1    11/1994
EP    0619381       10/1994
FR    2930561       4/2008

OTHER PUBLICATIONS

International Search Report for International Application No. PCT/EP2014/053457 dated May 19, 2014, 2 pages.

*Primary Examiner* — Rudy Zervigon
(74) *Attorney, Agent, or Firm* — TraskBritt

(57) ABSTRACT

A reactor device for chemical vapor deposition comprises a reaction chamber having a purge gas inlet. A gas discharge channel is linked to the reaction chamber via a circumferential opening in the inner wall of the chamber. The reaction chamber is arranged such that a purge gas stream flows from the purge gas inlet to the discharge channel. The inner wall of the reaction chamber comprises means for exchanging heat with the purge gas, for example, fins.

18 Claims, 3 Drawing Sheets

CHEMICAL VAPOR DEPOSITION DEVICE

CROSS-REFERENCE TO RELATED APPLICATIONS

This application is a national phase entry under 35 U.S.C. §371 of International Patent Application PCT/EP2014/053457, filed Feb. 21, 2014, designating the United States of America and published as International Patent Publication WO 2014/128267 A2 on Aug. 28, 2014, which claims the benefit under Article 8 of the Patent Cooperation Treaty and under 35 U.S.C. §119(e) to French Patent Application Serial No. 1351526, filed Feb. 21, 2013, the disclosure of each of which is hereby incorporated herein in its entirety by this reference.

TECHNICAL FIELD

The invention falls within the domain of fabrication of integrated circuits or microsystems and, more particularly, equipment and processes for vapor phase chemical deposition. The latter are also known in the prior art as "CVD" or "Chemical Vapor Deposition" methods equipment and processes.

BACKGROUND

Integrated circuits and microsystems are fabricated from wafers, or substrates, of silicon or any other semiconductor material, which undergo a series of steps of deposition of thin films of various materials, masking and lithography of these films, then etching of these same films. Between these fabrication steps are inserted steps of cleaning of the equipment and also steps of inspection of product quality.

In chemical depositions, an adsorption, a chemisorption or a heterogeneous reaction happens at the surface of the substrate to be covered. In the case of a chemical vapor deposition, this reaction happens on all the substrates in which the conditions of temperature, pressure and concentration of the reagents are present. The result is that the chemical deposits uniformly cover the surface with patterns formed on the substrates, even those that are substantially vertical. This feature is particularly useful in the fabrication of recent circuits and microsystems wherein the patterns to be covered can have very high shape factors (ratio of the width to the height of the pattern).

CVD equipment generally comprises a processing chamber wherein are housed a substrate support and a gas distribution assembly, also known by the term "showerhead." The latter delivers chemical agents in gaseous form, also known as "processing gas," or "precursors," close to the substrate. The support has an upper face suitable for holding the substrates and a lower face, opposite its upper face. The substrate support divides the inside of the processing chamber into an upper space and a lower space. The upper space is found on the side of the upper face of the support and is delimited by the walls of the processing chamber. The lower space is found on the side of the lower face of the support and is delimited by the walls of the processing chamber.

A purging gas is injected into the lower space of the processing chamber to limit contamination of the walls of the chamber by the chemical agents injected by the showerhead into the upper space of the chamber.

The Applicant has proposed the use of a gas discharge ring disposed around the support. The gas discharge ring allows a more homogeneous circulation of the gases flush with the substrates. This is, for example, described in the French patent application published under the number FR 2 930 561 and filed by the Applicant.

Accidental reactions between the gases or between a gas and a wall can occur and lead to solid deposits in the form of accidental films in unwanted places.

Accidental reactions can cause clogging of apertures of a gas discharge assembly and particularly the gas discharge ring. The clogging of some apertures disturbs the circulation of the gases and the quality of the products is affected thereby.

Moreover, the gas discharge assembly, once blocked, no longer fulfils its function adequately. Reactive gas flows are no longer homogeneous. The rest of the equipment, and particularly the reaction chamber, is in turn subject to accidental reactions at its surface. The particular contamination of the equipment impairs its effectiveness. The contamination makes it necessary to frequently clean the gas discharge assembly, the gas discharge ring and the rest of the chamber, which affects the availability of the processing chamber. Accidentally deposited films are liable to be transferred onto a substrate to be processed and thus affect the quality of thin film depositions. This is not satisfactory.

These accidental deposits are greater the higher the temperature. However, the support for the substrates is heated so that the substrates reach the temperature needed for the desired reactions. To limit phenomena of condensation of the reactive gases in contact with the distribution system, the latter is heated. The rest of the device thus tends to also be heated.

In so-called high-temperature conditions, typically between 600° C. and 800° C., these depositions require even more frequent cleaning and maintenance, which make the devices industrially unusable in these fields.

BRIEF SUMMARY

The invention provides an improvement to the situation.

For this purpose, provision is made for a reactor device for chemical vapor deposition of the type comprising:
 a reaction chamber having a purge gas inlet;
 a gas discharge channel connected to the reaction chamber by a circumferential opening in an inner side wall of the chamber, the reaction chamber being arranged so that a stream of purge gas circulates from the purge gas inlet to the discharge channel.

In accordance with the invention, the inner wall of the reaction chamber circulates from the purge gas inlet to the discharge channel.

According to an embodiment, the device comprises a substrate support having a peripheral surface, the plate being disposed in the reaction chamber so that at least a part of the peripheral surface of the plate is facing the heat exchange means.

Moreover, the reaction chamber typically has at least one reactive gas inlet facing a main surface of the plate intended to receive a substrate, a stream of reactive gas circulating in the reaction chamber from the reactive gas inlet to the discharge channel.

According to an embodiment of the invention, the heat exchange means comprise a plurality of fins protruding from the inner wall in the reaction chamber, the fins being arranged so as to guide the stream of purge as toward the circumferential opening.

Advantageously, the fins are distributed regularly over the inner wall of the reaction chamber.

According to an embodiment, the fins are regularly distributed around the substrate support plate.

According to an embodiment, the device comprises a body delimiting at least a part of the reaction chamber and at least a part attached to the body, the fins being made in the attached part.

Particularly advantageously, the attached part is a gas discharge ring comprising an outer wall and an inner wall defining a part of the inner wall of the reaction chamber, the outer wall being connected to the inner wall by a connecting wall arranged so as to form two annular channels extending on either side of the connecting wall and between the inner and outer walls, the connecting wall comprising holes to form a fluid connection between the channels, the ring being characterized in that the inner wall comprises the plurality of fins.

Preferably, the fins extend beyond the wall by at least 1 millimeter.

According to an embodiment, the fins each have a rectangular profile.

According to an embodiment, the distance separating two fins adjacent to each other is equal to the thickness of at least one of these fins.

The device further typically comprises a substrate support having a peripheral surface, the substrate support being disposed in the reaction chamber in such a way as to form an annular passage between the peripheral surface of the substrate support and the wall of the reaction chamber, the purge gas inlet having an annular shape and being delimited between the side wall of the reaction chamber and a wall of an additional part arranged in the reaction chamber.

Another subject of the invention relates to a gas discharge ring for a chemical vapor deposition reactor device comprising a reaction chamber having a purge gas inlet, a gas discharge channel connected to the chamber by a circumferential opening delimited at least in part by an inner wall of the ring, the ring comprising an outer wall connected to the inner wall by a connecting wall arranged so as to form two annular channels extending on either side of the connecting wall and between the inner and outer walls, the connecting wall comprising holes to form a fluid connection between the channels, the ring being characterized in that the inner wall comprises a plurality of fins.

BRIEF DESCRIPTION OF THE DRAWINGS

Other features, details and advantages of the invention will become apparent on reading the description detailed below, and the accompanying drawings, wherein.

Figure 1:
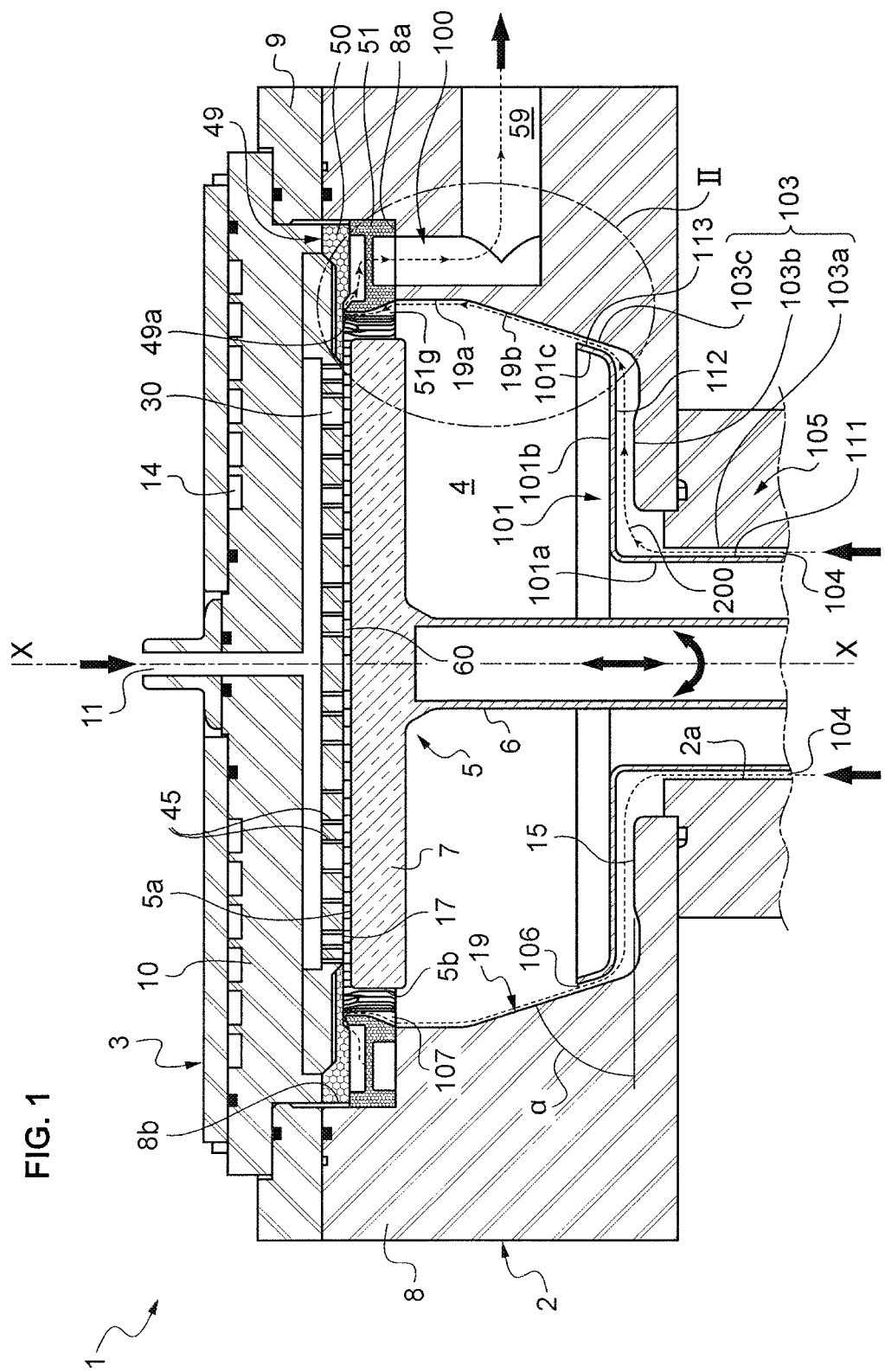
FIG. 1 shows an axial section view of a reactor according to the invention.

The accompanying drawings comprise elements of a certain nature. They can therefore not only be used to complete the invention, but also to contribute to its definition where applicable.

DETAILED DESCRIPTION

The figures show a processing device, or reactor with the overall reference number 1. In general, the processing device 1 has rotational symmetry about a central axis XX. This promotes the homogeneity of the chemical reactions and facilitates fabrication. This symmetry can have a few exceptions. On the drawings, this axis is vertical, which corresponds to the usual disposition of the device in operation. In the remainder of the text, the terms "top," "bottom," "horizontal" and "vertical" are used in accordance with the representation in FIGS. 1, 2 and 5. The reactor 1 has controlled pressure and temperature. The reactor 1 comprises a hollow body 2 and a lid 3 closing the body 2 to form a reaction chamber 4. The reaction chamber 4 can also be called an enclosure. The chamber 4 houses a support 5, or susceptor, for substrates. The reactor 1 is designed to allow the injection into the chamber 4 of at least one reactive gas from a top part of the chamber 4 and that of a purge gas from a bottom part of the chamber 4. The reaction chamber 4 delimits a reaction environment and its walls guide the streams of gas present, on the one hand, to promote reactions in certain areas only and, on the other, to discharge the mixed gases.

Figure 2:
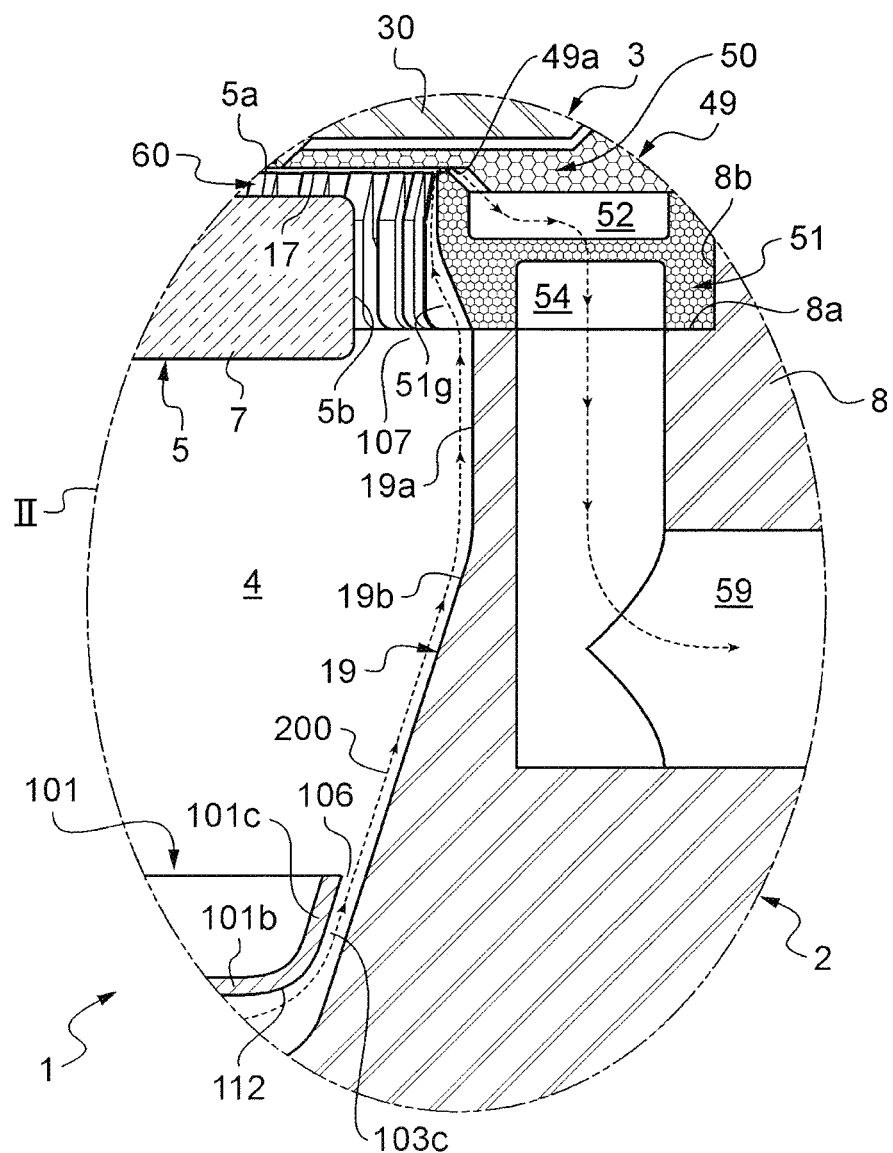
FIG. 2 shows a detail view II of FIG. 1.

The chamber 4 is delimited by a lower inner wall 15, an upper inner wall 17 and a side inner wall 19 which joins the lower wall 15 to the upper wall 17. Here, the lower wall 15 and the upper wall 17 each have a general disc shape, whereas the side wall 19 has the general shape of a solid of rotation and connects the peripheral edge of the inner wall 15 to the periphery of the upper wall 17. In the example of FIGS. 1 and 2, the lower wall 15 has a diameter less than that of the upper wall 17. Consequently, the side wall 19 comprises a substantially cylindrical upper portion 19a and a substantially frustoconical lower portion 19b connected to each other. The lower portion 19b tapers in the direction of the upper part 17.

The side wall 19 is connected to the upper wall 15 and to the lower wall 17 by fillets.

The support 5 here comprises a plateau 7 and an elongated base 6. The plate 7 has a lower main face fastened to an upper end of the base 6. In the example described here, the base 6 and the plate 7 of the support 5 are formed integrally. The base 6 passes through an opening 2a of the body 2 through the lower wall 15. The support 5 is assembled to be translationally movable in relation to the chamber 4. The support 5 can be moved to a top, so-called work position, wherein the plate 7 is close to the upper wall 17 and a bottom, so-called loading position, wherein the plate 7 is distant from the upper wall 17. In FIGS. 1 and 2, the support 5 is in the work position. In this position, the plate 7 is at a vertical distance from the upper wall 17, less than 20 millimeters and preferably greater than 5 millimeters.

The plate 7 can be assembled to rotate in relation to the chamber 4 and turn about the vertical axis XX of the base 6. The rotational velocity is a function of the desired flow velocity of the gas on the support 5, the size of the substrate, and the required/desired deposition velocity.

The plate 7 has an upper main face 5a opposite the lower face and intended to support one more substrates to be processed. The upper main face 5a is disposed facing the upper wall 17. The plate 7 has a peripheral surface 5b which connects the main face 5a to the lower face. The peripheral surface 5b extends substantially plumb with the upper main face 5a and over the thickness of the plate 7.

The support 5 can be equipped with a heat-regulating member, not represented, for example, of the type described in the patent application published with the number EP 0 619 381 filed on behalf of Applied Materials Inc., on 31 Mar. 1994. The heat-regulating member is selectively used to heat and/or cool. The heat-regulating member is used here to adjust the temperature of the substrates according to the desired chemical reactions.

In the work position, the distance separating the upper wall 17 from the upper main face 5a is small. This limits the effect of a vertical convection gradient, due to a temperature difference between the upper wall 17 and the main face 5a.

The peripheral surface 5b and the portion of the corresponding side wall 19, the top portion 19a in the work position, have rotational symmetry. In the work position, the peripheral surface 5b and the portion of the corresponding side wall 19 are concentric in relation to each other. In a variant, the side wall 19 and the peripheral surface 5b can follow a periphery of a shape other than circular, for example, square, rectangular, or oval.

The plate 7 has a general disc shape. The support 5 and particularly the plate 7 is made of a heat-conducting material withstanding temperatures above 800° C. The materials used make it possible to maintain the integrity of the support 5 in highly reductive media as is the case in the present of dihydrogen and ammonia. The support 5 is made of a material that further has a low thermal inertia to allow it to rapidly rise and fall in temperature during the various use phases.

The support 5 is here made of aluminum nitride (AlN). In a variant, it can be made of graphite and coated with a film of silicon carbide, so that the support 5 has increased resistance to chemical environments.

In a non-represented variant, a coolant is circulated in ducts arranged for this purpose in the body 2.

The cooling of the inner 15 and side walls 19 delimiting the chamber 4 reduces accidental surface deposits. The time required for cleaning the chamber 4 is thereby reduced, thus increasing the productivity of the reactor 1.

After placing a substrate on the support 5, the lid 3 is sealingly closed. In a variant, the introduction and removal of the substrates onto the support 5 can be carried out via a transfer chamber under vacuum, where applicable equipped with a robot.

The lid 3 comprises a main part 10, furnished with a main gas inlet 11 forming a source of reactive gas for the reactor 1 and means of thermal regulation of the gas. The lid 3 comprises an outer part 9 resting on the body 2 and supporting the main part 10. The outer part 9 of the lid 3 has a general ring shape resting on an upper surface of a main part 8 in the upper part of the body 2. The lid 3 comprises an injection disc 30 forming at least part of the upper wall 17 of the chamber 4 and fastened to the main part 10, for example, by screwing. The injection disc 30 further houses part of a system for injecting reactive gas coming from the first inlet 11.

The main part 8 of the body 2 is made of a metal alloy. In general, most of the components at least partly housed inside the chamber 4 can be made of aluminum or of an aluminum alloy exhibiting little degassing at high temperature.

The main part 10 of the lid 3 has a general disc shape. The main part 10 can be made of a light alloy, here aluminum. The main part 10 is heat-conducting and pierced by a central hole making a fluid connection between the first gas inlet 11 of the reactor 1 and the reactive gas injection system of the injection disc 30.

The reactive gas injection system housed in the injection disc 30 comprises means for regulating the heat of the reactive gas. The means for regulating the heat of the reactive gas here comprise a heating element 14 that includes an annular part containing a coolant circulated in a cooling/heating circuit. Such a gas injection system and such a heat-regulating system are, for example, described in the French patent application published under the number FR 2 930 561 and filed 28 Apr. 2008 on behalf of the Applicant.

The injection disc 30 is held in place axially between an inner surface of the main part 10 of the lid 3 and a ring 49 for evacuating the cases of the reactor 1. The injection disc 30 forms a large, central part of the upper wall 17 of the chamber 4. The space separating the injection disc 30 from the substrate support 5 can be seen as a work space 60 extending between the main upper surface 5a of the support 5 and the upper wall 17 of the chamber 4. The work space 60 is the desired place of reaction between the reactive gas and the substrates and/or between the reactive gases.

The injection disc 30 houses channels 45 making a fluid communication between the central hole of the main part 10 and the chamber 4. The channels 45 extend through the injection disc 30 substantially vertically. The channels 45 open into the upper wall 17, in the work space 60 of the chamber 4. The channels 45 are regularly distributed in the injection disc 30 while their mouths are evenly distributed on the surface of the chamber 4 carried by the upper wall 17. The inlet 11 of the lid 3, the central hole of the main part 10 and the channels 45 of the injection disc 30 together form, from upstream to downstream, a supply of reactive gas for the chamber 4.

In the embodiment described here, provision is made for an additional gas supply, for a second reactive gas. The injection disc 30 is provided with a plurality of additional channels forming part of the additional reactive gas supply. The additional channels open into the work space 60 of the chamber 4 between the upper main surface 5a and the upper wall 17. The additional chambers are supplied from a second gas of the reactor 1 substantially similar and separate from the first inlet 11. The additional gas supply is not represented.

The heating element 14 makes it possible to keep the reactive gas(es) upstream of the chamber 4, at a temperature at which the latter are chemically stable, for example, a temperature above their dew point to avoid condensation phenomena. Moreover, the injection disc 30 can be made of a material with high thermal conductivity, for example, a light alloy of aluminum (Al), which makes it possible to regulate the temperature of the injection disc 30 by contact with the main part 10 of the lid 3 and heat conduction. The temperature of the injection disc 30 is chosen to limit accidental reactions of the gaseous reactants due to being flush with the injection disc 30.

The reactive gas enters the reactor 1 by the inlet of the lid 3. Downstream of the inlet 11, the reactive gas enters the reaction chamber 4 via the mouths of the channels 45. The channels 45 form a reactive gas supply into the reaction chamber 4.

A gas discharging ring 49 is assembled on an annular surface 8a of the main part 8 of the substantially horizontal body 2 and is surrounded by a cylindrical surface 8b of the body 2 forming a bore. The ring 49 is, in the example described here, a part attached to the body 2. In a variant, the ring 49 can be form a single part with the body 2 or even be one piece. The gas discharging ring 49 can also be in contact with a peripheral part of an inner surface of the injection disc 30.

In the work position represented in FIG. 2, the ring 49 surrounds the work space 60. The ring 49 is also disposed at least partly around the plate 7 of the support 5. As can be seen in FIGS. 1 and 2, part of the ring 49 forms a part of the side wall 19, and another part of the ring 49 forms a part of the upper wall 17. The mutual shape of the ring 49 and the support 5 is such that, in a work position, the support 5 is disposed partly in the ring 49 and a passage 107 is formed between the peripheral surface 5b of the support 5 and a part of the side wall 19 belonging here to the ring 49. The passage 107 here takes the form of a peripheral annular channel in the top part of the chamber 4. The horizontal distance between the side wall 19 and the support 5, i.e., here between the ring 49 and the peripheral surface 5b, is here between 10 and 30 millimeters.

The gas injection channels 45 of the upper wall 17, the upper main surface 5a and the gas discharging ring 49 are disposed in such a way that a stream of reactive gas flows from the injection channels 45 to the gas discharging ring 49 passing through the work space 60. The reactive gases are introduced via the inlet 11 of the reactor 1, through the injection disc 30, and circulate in the work space 60 flush with the upper main surface 5a. The unconsumed precursors continue their journey toward the ring 49 in substantially radial directions from the center to the periphery of the plate 7 of the support 5.

In the example described here, the ring 49 takes the form of an assembly of several parts. The ring 49 comprises an upper part 50 represented in isolation in FIG. 4 and a lower part 51 in isolation in FIG. 3. The longitudinal sections along a half-plane comprising the axis of rotation of the upper part 50 and of the lower part 51 in an assembled state can be seen in FIG. 5.

The upper part 50 takes the form of an annular part of a section substantially regular about its circumference. The upper part 50 comprises a lower surface (not visible in FIG. 4). The lower surface here includes a lower surface that is radially exterior 50a and a lower surface that is radially interior 50b connected together by a frustoconical lower surface 50c. The radially outer lower surface 50a and the radially inner lower surface 50b are generally planar and mutually parallel. The radially inner lower surface 50b is offset upwards, i.e., toward the injection disc 30 in the assembled state, in relation to the radially outer lower surface 50a so that the frustoconical lower surface 50c is oriented toward the center of the chamber 4.

The upper part 50 comprises an upper surface. The upper surface here includes a radially outer upper surface 50d and a radially inner upper surface 50e connected together by a frustoconical upper surface 50f. The radially outer upper surface 50d and the radially inner upper surface 50e are planar and mutually parallel. The radially inner upper surface 50e is offset downward, i.e., toward the lower part 51 in the assembled state, in relation to the radially outer upper surface 50d so that the frustoconical upper surface 50f is oriented toward the center of the injection disc 30.

The thickness of the upper part 50 along the vertical direction is greater plumb with the radially outer upper surface 50d than plumb with the radially inner upper surface 50e. The upper part 50 also comprises a substantially cylindrical outer surface 50g of a corresponding shape with the bore 8b of the body 2 and an inner surface 50h of small axial dimensions, here slightly frustoconical. The outer surface 50g is adapted to the bore 8b of the body 2 to be able to be inserted therein. The radially inner upper surface 50e, the frustoconical upper surface 50f and the inner surface 50h are of a shape corresponding to the periphery of the injection disc 30. The shapes and dimensions of the ring 49 allow the latter to be adjusted both with the injection disc 30 and in the bore 8b. The radially outer upper surface 50d is in contact with a lower surface of the main part 10. When the ring 49 is mounted in the body 2, the inner lower surface 50b and the lower surface of the injection disc 30 are substantially aligned and almost continuous. An inner portion of the upper part 50 carrying the radially inner lower surface 50b forms a peripheral part of the upper wall 17. The inner portion of the upper part 50 and the injection disc 30 together form at least a part of the upper wall 17 of the chamber 4.

The upper part 50 acts as a spacer between the main part 10 of the lid 3 and the lower part 51 of the ring 49. The upper part 50 of the gas discharging ring 49 is made of a material withstanding rapid variations in temperature without deteriorating, for example, aluminum here.

Figure 5:
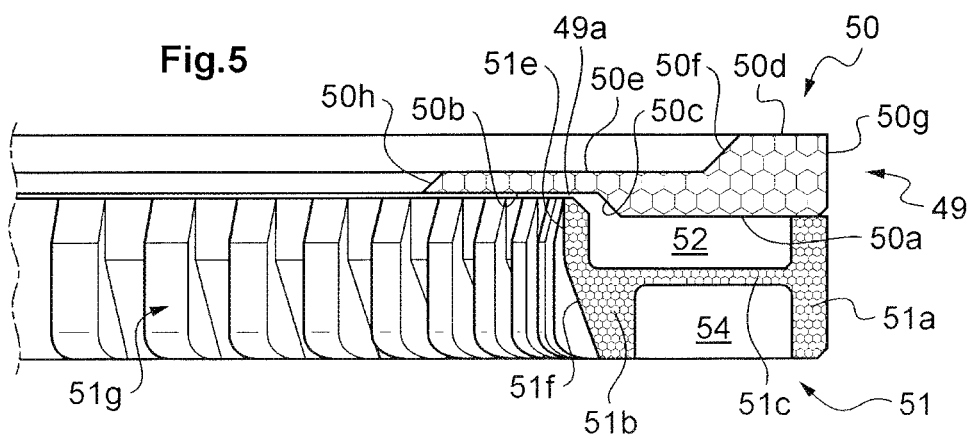
FIG. 5 shows an axial section part of the discharging ring formed by the assembly of the parts from FIGS. 3 and 4.

As can be seen in FIG. 5, the lower part 51 has a general annular shape with an H-shaped cross section. The lower part 51 comprises an outer wall 51a, an inner wall 51b and a connecting wall 51c connecting the outer wall 51a to the inner wall 51b. The outer wall 51a and the inner wall 51b are of generally cylindrical shape. The inner wall 51b has a height strictly less than the vertical distance separating the radially inner lower surface 50b of the upper part 50 and the annular surface 8a of the body 2 in the assembled state. Thus, a circumferential opening or gap 49a is formed between the upper part 50 and the inner wall 51b of the lower part 51. In the variant wherein the ring 49 is made of a single part instead of an assembly of parts, the gap 49a is then made in the part.

The connecting wall 51c is disposed between one-third and two-thirds of the height of the outer wall 51a, for example, here substantially halfway up it. In the installed state, the outer wall 51a and the inner wall 51b are substantially vertical whereas the connecting wall 51c is substantially horizontal. When the ring 49 is disposed in the body 2, the inner wall 51b forms part of the side wall 19.

A lower annular channel 54 is formed between the inner wall 51a, the outer wall 51b, the connecting wall 51c and the annular surface 8a of the body 2. An upper annular channel 52 is formed between the outer wall 51a, the inner wall 51b, the connecting wall 51c and the radially outer lower surface 50a of the upper part 50, see FIG. 5. The connecting wall 51c is pierced by a plurality of communication holes 53. The holes 53 allow the upper channel 52 to communicate with the lower channel 54. The lower channel 54 is in communication with a pumping channel 59 formed in the body 8 and a gas discharging outlet of the reactor 1. The holes 53 and the pumping channel 59 are exceptions to the rotational symmetry of the reactor 1.

The assembly comprising, from upstream to downstream, the upper channel 52, the holes 53, the inner channel 54 and the pumping channel 59 forms a gas discharging channel 100. The gap 49a belongs both to the reaction chamber 4 and to the gas discharging channel 100. The gap 49a then forms a gas outlet of the chamber 4 and a gas inlet for the gas discharging channel 100.

The gap 49a forms a circumferential space in the gas discharging ring 49 opening around the work space 60. The gap 49a allows fluid communication between the chamber 4 of the inner side of the inner wall 51b and the gas discharging channel 100. The circumferential opening 49a formed in the side wall 19 forms a fluid connection between the passage 107 to the upper channel 52 to discharge gases from the reaction chamber 4 toward the outside of the reactor 1.

Figure 3:
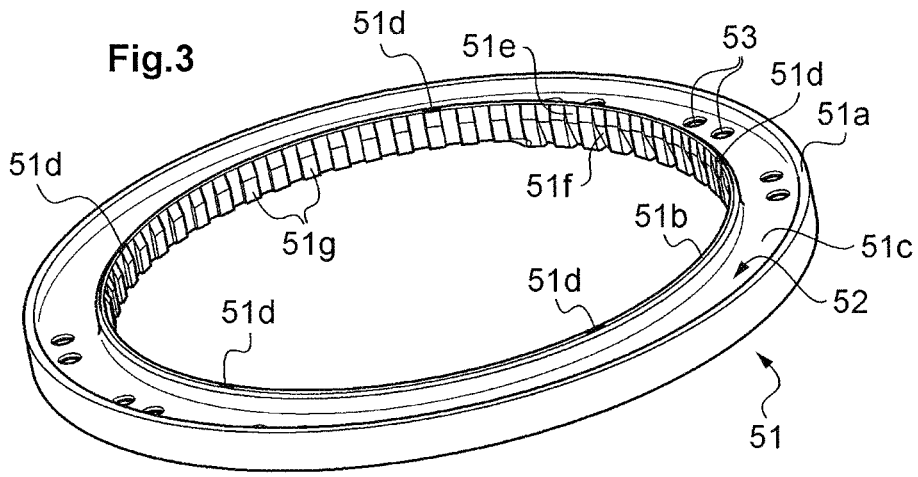
FIG. 3 shows a perspective view of a part of a ring for discharging the gas from the reactor in FIGS. 1 and 2.
Figure 4:
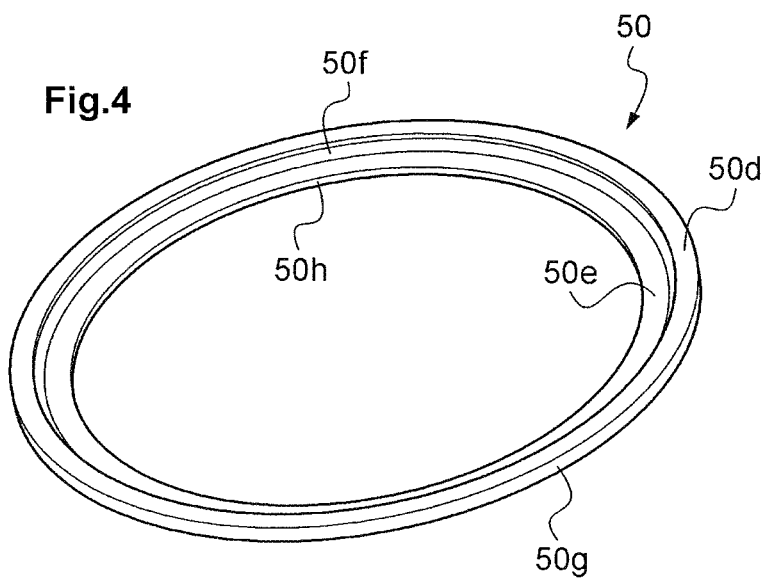
FIG. 4 shows a perspective of a part of a gas discharging ring supplementary to that in FIG. 3.

The upper surface of the inner wall 51b comprises pads 51d protruding toward the upper part 50, see FIG. 3. The pads 51d have a height substantially equal to the height of the gap 49a. The pads 51d have a height substantially equal to the height of the gap 49a. The pads 51d are in contact with the radially inner lower surface 5ob of the upper part 50. In an assembled state, the pads 51d of the lower part 51 form bearing portions for the upper part 50 of the ring 49. The pads 51d keep the upper part 50 and the lower part 51 at a distance from each other to form the gap 49a. The pads 51d are regularly distributed around the circumference and form interruptions of the gap 49a over small angular portions in relation to the total circumference of the ring 49. The pads 51d form exceptions to the rotational symmetry of the ring 49. Although the gap 49a is formed by a series of open parts and pads 51d, the gap 49a is considered as continuous from the point of view of circulation of the gases.

An angular opening of the gap 49a over the total or almost total circumference of the ring 49 allows discharging with homogeneous suction of gas and with laminar flow in the range of flow rates envisioned. For example, a flow rate of less than 10 slm can be employed at a pressure between 200 and 300 Torr, or 10 liters per minute under standard temperature conditions (around 20° C.) and at 266 to 400 hPa.

The reactive gases come from the channels 45 and are evacuated via the gap 49a disposed at the periphery of the work space 60 of the chamber 4 and close above the passage 107. This makes it possible to regularize the fluid flow lines in the chamber 4. In operation, a stream of reactive gas circulates in the work space 60 of the chamber 4, from the channels 45 to the gap 49a. The gap 49a between the upper part 50 and the lower part 51 of the ring 49 has a maximum height between 0.5 and 2 millimeters.

The inner wall 51b, the inner surface of which partly defines the chamber 4, forms part of the side wall 19 and here defines the passage 107. The inner wall 51b here bears on the inner side an upper cylindrical surface 51e above the connecting wall 51c and a lower frustoconical surface 51f, in the extension of the cylindrical surface 51e, beneath the connecting wall 51c, and oriented toward the center of the chamber 4. In a variant, the inner surface of the ring 49 can comprise a lower frustoconical surface and an upper frustoconical surface. The angle of inclination of the lower frustoconical surface is greater than that of the upper frustoconical surface.

The reactor 1 comprises an additional part 101. The additional part 101 takes the general shape of a rotational part or tubular part with the diameter varying along an axis of rotation.

Successively and from the bottom to the top in the mounted state in the chamber 4, the additional part 101 comprises a cylindrical portion 101a, a shoulder portion 101b and a frustoconical portion 101c. The additional part has a first wall comprising respective surfaces 111, 112, 113 of the portions 101a, 101b, 101c arranged facing the lower wall 15 and the bottom portion 19b of the side wall 19 of the reaction chamber 1. The first wall of the additional part 101 has shapes and dimensions corresponding to the shapes and dimensions of a lower part of the chamber 4 and of the opening 2a of the body 2. The additional part 101 is disposed partly in the chamber 4 and partly in the opening 2a, under the substrate support 5 and at a distance from the gases discharging ring 49. In the work position, the plate 7 is at a distance from the additional part 101. The position of the additional part 101 is here the same in the work position as in the loading position.

The outer diameter of the cylindrical portion 101a is strictly less than the inner diameter of the bore of the opening 2a of the body 2 so that the cylindrical portion 101a can be inserted into the opening 2a, without contact with the surface of the opening 2a. The cylindrical portion 101a is aligned and centered in the opening 2a. The base 6 of the support 5 is disposed inside the cylinder formed by the cylindrical portion 101a. An annular space is preserved between the outer surface of the cylindrical portion 101a and the bore of the opening 2a. The cylindrical portion 101a is fastened by its lower end to the rest of the chamber 4 (not represented in the figures). The cylindrical portion 101a is here a fastening portion of the part added to the reaction chamber 4.

The shoulder portion 101b takes the form of a crown extending substantially perpendicularly and toward the outside of the cylindrical portion 101a. The shoulder portion 101b is connected to form a single part with the top end of the cylindrical portion 101a. The shoulder part 101b forms a planar radial wall of thickness substantially equal to that of the wall of the cylindrical portion 101a. The inner diameter of the shoulder portion 101b corresponds to the diameter of the cylindrical portion 101a. The outer diameter of the shoulder portion 101b is strictly less than the diameter of the lower wall 19 of the chamber 4. The shoulder portion 101b is disposed substantially parallel and above the lower wall 15 of the chamber 4. The shoulder portion 101b is in contact with the lower wall 15. The shoulder portion 101b is not in contact with the inner wall 15. A space is preserved between the inner wall 15 of the chamber 4 and the surface 112 of the first wall in the shoulder portion 101b.

The frustoconical portion 101c extends upward away from the axis of rotation from the periphery of the shoulder portion 101b. The frustoconical portion 101c is connected to the shoulder portion 101b. The frustoconical portion 101c is of a thickness substantially equal to that of the cylindrical portion 101a and of the shoulder portion 101b. The conicity of the cylindrical portion 101a is substantially equal to that of the bottom portion 19b of the side wall 19. At least a part of the bottom portion 19b is facing the surface 113 of the first wall in the frustoconical portion 101c, this part forming a second portion of the side wall 19. The outer radius of the frustoconical portion 101c increases evenly in an upward vertical progression, so that the wall of the frustoconical portion 101c is straight in a section view as in FIGS. 1 and 2. The outer radius of each section of the frustoconical portion 101c is strictly less than the inner diameter of the section of the second portion of the side wall 19 which is facing it. The frustoconical portion 101c is arranged concentrically to the side wall 19 of the chamber 4. The frustoconical portion 101c is not in contact with the side wall 19. A space is preserved between the side wall 19 of the chamber 4 and the surface 113 of the first wall in the frustoconical portion 101c. The frustoconical portion 101c extends over a height, in the vertical direction, preferably greater than 10 millimeters, for example, here 15 millimeters. The position and height of the frustoconical portion 101c are such that the additional part 101 does not hinder the descent of the plate 7 to reach a loading position.

In the example described here, the support 5 and the additional part 101 are mutually shaped and arranged in such a way that the support 5 can be moved in translation in the chamber 4 to a position where it is surrounded by the additional part 101, for example, in the loading position. The diameter of the peripheral surface 5b is less than the inner diameter of a part at least of the frustoconical portion 101c. The additional part 101 has a second wall opposite the first wall and oriented toward the support 5, the second wall having a concave shape forming a housing of the peripheral surface 5b in the loading position of the support 5.

The additional part 101 is disposed in a bottom part of the chamber 4, the annular spaces between the first wall of the additional part 101 formed of the surfaces 111, 112, 113 and the surfaces of the chamber 4 forming sections of a channel 103 of annular shape. A first section 103a defined between the cylindrical portion 101a and the bore 2a is of substantially cylindrical shape. A second section 103b defined between the shoulder portion 101b and the lower wall 15 is of substantially crown shape. A third section 103c defined between the frustoconical portion 101c and the second portion of the side wall 19 is of substantially frustoconical shape. The shape and dimensions of the additional part 101 are a function of the configuration of the chamber 4 so that the channel 103 has the most even section possible. The form and dimensions of the first wall of the additional part 101 are a function of the chamber 4 so that as laminar a flow as possible of the stream of purge gas 200 in the channel 103 is encouraged.

In particular, to encourage such a laminar flow, it is arranged for the side wall 19 of the reaction chamber 1 and the first wall of the additional part 101 to be parallel in the third section 103c up to the mouth 106 of the duct in the chamber 4. Regarding this, the side wall 19 of the reaction chamber 1 and the first wall of the additional part 101 are parallel over a length greater than or equal to 1 cm up to the mouth 106. Advantageously, the length of the portion of the channel in which the side wall 19 of the reaction chamber 1 and the first wall of the additional part 101 are parallel is dimensioned to inject a laminar stream of purge gas for a flow velocity of the gas between 0.35 m/s and 0.55 m/s.

The radially outer surface of the additional part 101 forms guiding surfaces 111, 112, 113. The channel 103 follows the shape of the guiding surfaces 111, 112, 113 and the shape of the bottom of the chamber 4. The channel 103 thus has a diameter varying according to the section of the additional part 101 and the section of the chamber 4 that delimit it. In other words, the diameter of the channel 103 is greater than that of the section of the additional part 101 that delimits it and less than that of the section of the chamber 4 that delimits it. The side wall 19 and the first wall of the additional part 101 together delimit the channel 103 and in particular the third portion 103c.

The free end of the frustoconical portion 101c and the part of the side wall 19 the closest thereto define a mouth 106. In other words, the channel 103 terminates in the mouth 106. The channel 103 opens into the chamber 4 by way of the mouth 106.

A purge gas injector 105 comprises, from upstream to downstream, a second gas inlet 104 of the reactor 1, the channel 103 and the mouth 106. The channel 103 opens onto the reaction chamber 4 by the mouth 106. On the floor of the chamber 4 and of the opening 2a is formed the second gas inlet or supply 104 intended to form the source of a purge gas for the reactor 1. The inlet 104 makes it possible to inject a purge gas, for example, using nitrogen (N) or Argon (Ar), from the floor of the chamber 4. The second inlet 104 opens into the bottom of the first portion 103a of the channel 103. In other words, the second inlet 104 is upstream of the channel 103, itself upstream of the mouth 106. When the additional part 101 is mounted in the chamber 4, the channel 103 defined between the first wall of the additional part 101 and the side wall 19 forms an extension of the gas injector 105. The channel 103 is arranged to direct a stream of purge gas 200 parallel to the side wall 19. The purge gas injector 105 opens into the reaction chamber 4. The second gas inlet 104 forms an inlet for purge gas in the reactor 1 whereas the mouth 106 forms an inlet for purge gas in the chamber 4.

The laminar flow of the purge gas along the side wall 19 and in the passage 107 prevents the reactive gases coming from the work space 60 to penetrate into the lower space of the reaction chamber 4. The stream of purge gas 200, laminar when it crosses the passage 107, creates an excess of pressure and drives the reaction gases toward the gas discharging ring 49.

The Applicant has observed that the availability of a chemical vapor deposition device equipped with such a purge gas system is at least twice as high when the stream of purge gas 200 is turbulent. It is thus possible to reduce the cleaning frequency of the reaction chamber 4 without having an adverse effect on the quality of the deposited films.

Moreover, the flow rate of purge gas required when the flow is turbulent is greater than that of a laminar flow for a given effectiveness, other parameters being moreover similar. By way of example, during a vapor deposition of amorphous or polycrystalline silicon, the flow rate of the stream of purge gas 200 is of around 5 liters per minute, whereas it is greater than 10 liters per minute in the presence of turbulence (under standard temperature conditions.)

In the existing systems, the purge gas tends to partly dilute the reactive gases in the upper space. The reduction in the flow rate of the reactive gases further limits the contamination of the reaction chamber 4. By way of example, the Applicant was able to reduce the flow rate of the reactive gas (silane, for example) in a reaction chamber with a purge system according to the invention at 20 sccm whereas in the presence of a conventional system, the flow rate would have to be around 50 sccm, i.e., 20 milliliters per minute instead of 50 milliliters per minute (under standard temperature conditions).

The reduction of the flow rate of purge gas initiates a virtuous circle and several advantages: the concentration of reactive gas in the upper space is increased, the yield of desired chemical reactions is increased, wastage and thus consumption of reactive gas can be reduced. The reduction of consumption of consumable species generates a reduction in cost.

In the figures, an accessory part is attached and mounted in the reactor to form the additional part 101. The shape of the accessory part, here a hollow rotation part, is adapted to the reactor of the example. In variants, the additional part 101 can be formed of a single part, or even one piece, with other components of the reactor 1. Shaping an accessory part for the purpose of attaching it in a reactor makes it possible to facilitate the fabrication and even to equip pre-existing reactors. Furthermore, the second wall of the additional part is one of the surfaces of the reaction chamber, the most liable to give rise to undesirable deposits; the fact that the part is removable makes it possible to clean it more easily and where applicable to replace it with a clean part, which minimizes the immobilization time of the reactor. In variants, the shapes of the additional part 101 differ from those described here as a function of the shapes of the reaction chamber 4.

In the example described herein, the additional part 101 is made of a single holding part by plastic deformation of a length of aluminum (Al) tube. In a variant, the additional part 101 is produced by assembling several parts. The additional part 101 can be produced by molding and made of any other material having comparable mechanical and corrosion-resistance characteristics. Preferably, the additional part 101 has homothetic profiles or forms a rotation part. This simplifies its fabrication and avoids errors of mounting in the chamber 4.

The stream of purge gas 200 flows from the bottom to the top in the channel 103. From the inlet 104, the purge gas rises in the first length 103a, in the second length 103b, in the third length 103c and exits the channel 103 at the top end of the frustoconical portion 101c through the mouth 106 to emerge in the chamber 4. At the mouth 106 the frustoconical portion 101c is at a distance from the lower side wall 19 at 10 millimeters, and preferably between 4 and 8 millimeters.

An end portion of the channel 103 is substantially parallel to the portion of the side wall 19 immediately downstream of the mouth 106. The channel 103 is arranged to direct the stream of purge gas 200 parallel to the side wall 19 at least over a part of the latter close to the mouth 106.

During the work phase, the stream of purge gas 200 is guided from the channel 103, between the second portion of the side wall 19 and the surface 113 of the additional part 101, in such a way that a part at least of the stream of gas 200 ends up in the passage 107. The channel 103 and the passage 107 are disposed substantially in the extension of each other so that a gas injected from the inlet 104, flowing allowing the channel 103 and emerging in the chamber 4 via the mouth 106 along the side wall 19, flows substantially according to a laminar regime along the side wall 19. The purge gas then rises up again along the side wall 19 of the chamber 4 until the passage 107.

The mouth 106 and the passage 107 each have an annular shape. This identity of shape improves the laminar behavior of the flow of gas between the mouth 106 and the passage 107. Although the shape of the channel 103 upstream of the mouth 106 makes it possible to further improve the orientation of the stream of purge gas 200, the identity of shape between the mouth 106 and the passage 107 itself makes it possible to improve the laminar behavior of the stream of purge gas 200.

The side wall 19 is advantageously arranged to support a laminar stream of purge gas along the wall at least of the mouth 106 to the passage 107. As is visible in FIGS. 1 and 2 in the work position, the stream of gas 200 has no physical support on the diametrically inner side of the reactor 1. The side wall 19 is sufficient to guide the stream of purge gas 200. The stream of gas 200 exiting the channel 103 by the mouth 106 and parallel to the side wall 19 at a chosen velocity has a thickness corresponding to the mouth 106. The velocity being non-zero, a depressurization is generated between the stream of gas 200 and the side wall 19. The side wall 19 attracts the stream of gas 200 and guides it between the mouth 106 and the passage 107. The side wall 19, on the diametrically outer side, supports the gas rising between the mouth 106 and the passage 107. The side wall 19 can have a straight shape, slightly concave or slightly convex along the direction of flow, while continuing to guide the stream of a gas in the absence of corresponding facing surface.

The top portion 19a and the bottom portion 19b of the side wall 19 here form a slight change of direction (a slightly concave shape) for the gas flow without it having an adverse effect on the laminar behavior of the stream. On the contrary, the Applicant has observed that a change of direction of an angle between 10° and 30° limits the risk of creating a turbulent regime. As can be seen in the figures, the change of direction corresponds to a right angle from which α is subtracted (90°—alpha). The angle α (alpha) between the bottom portion 19b and a horizontal wall plane is between 60 and 80°.

The fact that the mouth 106 is flush with the side wall 19 improves the laminar behavior of the stream downstream of the mouth 106. The side wall 19 forms an extension of the periphery of the mouth 106, which is able to deviate the stream of gas 200 to make it follow the direction of the side wall 19 up to the passage 107.

The purge gas reaches the passage 107, between the first portion of the side wall 19, here the inner wall 51b of the ring 49, and the peripheral surface 5b of the support 5. The passage 107 is shaped to guide the stream of purge gas 200 coming from the channel 103 in such a way that a part at least of the stream of gas 200 passes through the circumferential opening 49a.

Passing along the upper cylindrical surface 51e and the lower cylindrical surface 51f of the inner wall 51b of the ring 49, the stream of purge gas 200 increases the heat exchange between the ring 49 and the inside of the chamber 4. The stream of purge gas 200 contributes to the cooling of the ring 49, which tends to heat up in contact, direct or indirect, with the heating elements.

For this purpose, the inner wall 19 of the reaction chamber 1 comprises means for exchanging heat with the purge gas that cooperate with the gas to cool the inner wall upstream of the opening 49a in order to limit unwanted deposits on the wall.

The means are advantageously arranged in the passage 107.

According to a preferred embodiment illustrated in FIG. 3, the heat exchange means comprise fins 51g carried by the side wall 19. The fins 51g are similar to one another. The fins 51g protrude from the inner surface of the ring 49 in the direction of the center of the ring 49. In the installed state of the ring 49 in the body 2, the fins 51g protrude into the passage 107. The fins 51g are of substantially elongate shape along the vertical direction and over the height of the inner wall 51b. The fins 51g protrude from the side wall 19 by at least 1 millimeter, preferably at least 5 millimeters. The protruding dimensions of the fins 51g is not taken into account when calculating the separation between the substrate support 5 and the side wall 19. Nonetheless, horizontal ends of the fins 51g are at a distance from the peripheral surface 5b. The vertical ends of the fins 51g are connected to the vertical ends of the inner wall 51b by fillets. The fins 51g are distributed regularly around the circumference of the ring 49, here on the inner wall 51b. The peripheral surface 5b faces the fins 51g; the fins 51g are here distributed regularly around the plate 7.

As can be seen in FIGS. 3 and 5, the thickness of the fins 51g is substantially equal to their mutual separation. The distance separating two fins 51g adjacent to each other is equal to the thickness of one of the fins 51g. In a section view along a plane perpendicular to the axis of rotation of the ring 49, the fins 51g have a rectangular profile. In other words, to the nearest curvature of the ring 49, the series of fins 51g forms a succession of notches in a repetition of patterns. The notches, as well as the holes 53 and the pads 51d form exceptions to the rotation symmetry of the ring 49.

In the example described here, the fins 51g are made in the inner wall 51b of the attached part that is the ring 49. This facilitates fabrication. In a variant, the fins 51g are made in the side wall 19.

In general, the shapes and dimensions of the fins 51g are such that the inner surface of the ring 49 provided with the fins 51g has a large surface area of contact in the chamber 4 (here with the gases in the chamber 4). One of the functions of the fins 51g is that of heat exchanger fins. Such a contact surface improves the heat exchanges between the ring 49 and the inside of the chamber 4. The shapes and dimensions of the fins 51g are further chosen so that a contact between the support 5 and the ring 49 is avoided. The fins 51g give the inner wall 51b of the ring 49, and thus the side wall 19, a free surface greater than that of a similar configuration without fins. In operation, the ring 49 is kept at a temperature below that of a similar ring without cooling fins. The fins 51g, for example, make it possible to keep the temperature of the ring 49 below 300° C. Such a temperature limits the softening of the ring 49 and accidental deposits on the surfaces of the ring 49.

This regulation of the temperature makes it possible to limit accidental reactions of the reaction gases that come into contact with the ring 49 and with the side wall 19. The solid deposits resulting from such reactions are limited.

The cooling of the ring 49, owing to the fins 51g, is more effective when a stream of purge gas 200 circulates in contact with them. This is even more effective owing to the additional part 101, which makes it possible to generate a laminar stream of purge gas flowing between the mouth 106 and the passage 107. The passages between the fins 51g are taken by the purge gas, which flows at a distance from the work space 60. The stream of purge gas has an almost neutral effect on the dynamic of the gases in the work space 60. The stream of purge gas being laminar, its time of stay in the chamber 4 is minimized compared to that of a turbulent stream, which increases the effectiveness of the heat exchanges.

The presence of the fins 51g tends to reduce the passage section of the passage 107 and limits the migration of the reactive gases toward the lower space.

The shapes and dimensions of the fins 51g described here are an example of an embodiment. Other shapes and dimensions can be envisioned. In a variant, the fins 51g can have a thickness in the direction of the circumference that is different from the mutual separation of the fins. The fins can, for example, have a triangular, "sawtooth," rounded or dome-shaped profile.

If a stream of gas, for example, a stream of purge gas 200, flows against the inner wall 51b, against the side wall 19, the fins 51g can further be advantageously arranged to guide the stream of gas crossing the passage 107. In this case, the fins 51g further improve the laminar properties of the gas flow. The stream of gas is better guided between each fin 51g while remaining supported by the side wall 19. Here, the fins 51g are in contact with the stream of purge gas 200 and oriented parallel to the latter (vertical).

In variants, the fins 51g are disposed elongate along a direction different to the vertical, for example, along a slightly helicoidal direction akin to an inner threading of the ring 49.

In the preferred embodiment represented in the figures, the fins 51g are disposed on the inner wall 51b of the ring 49. The heat exchange between the fins 51g and the chamber 4 arises in the immediate vicinity of the gas discharge channel 100 to regulate the temperature of the inner surfaces of the gas discharge channel 100. The fins 51g are distributed away from the stream of reactive gas to avoid accidental deposits occurring there. In a variant, the fins 51g can be disposed in places on the side wall 19 different from the inner wall 51b.

As is represented in FIGS. 1 and 2, the stream of purge gas 200 drives the stream of gaseous precursors toward the ring 49 through the circumferential opening 49a. This avoids reactive gases flowing under the support 5 and being deposited there, i.e., forming deposits there. The stream of purge gas 200 around the substrate support 5 prevents the reagents from descending into the reaction chamber 4. The stream of purge gas 200 and the stream of reactive gas, mixed together are evacuated by way of the circumferential opening 49a, of the upper channel 52, the holes 53, the lower channel 54 of the ring 49 and via the purge channel 59, in other words via the gas discharging channel 100.

The reaction gases flow on the substrate and the upper main face 5a of the support 5 up to the ring 49. The gas stream is essentially parallel to the surfaces of the substrate and the support 5 and has a laminar regime. This guarantees a uniform thickness of deposition for all substrates bearing on the support 5.

The reactor 1 can thus employ temperatures adapted to the gases used for the new generations of devices produced on substrates, particularly the vaporized solutions of solid precursors or else gases having a tendency to condensation or deposition of solid residues. High temperatures can be used.

The gas discharging ring 49 tends to be heated indirectly by thermal conduction from the other heating elements and by convection through contact with hot reactive gases. In order to limit the accidental reactions of the gases in the discharging circuit, which could lead to blockages, the gas discharging ring 49 is kept at a temperature below the reaction temperature of the gases.

An improved reactor for chemical vapor deposition has just been described.

The reactor 1 is provided with fins 51g protruding from the side wall 19 separating the reaction chamber 4 from the gas discharge channel 100, on the side of the reaction chamber 4. This configuration encourages heat exchanges between the side wall 19 and the inside of the chamber 4. The temperature of the side wall 19 and the gas discharge channel 100 is regulated by thermal conduction. Thus, accidental reactions are reduced, particularly in the gas discharge channel 100.

The passage 107 delimited by the support 5 and the side wall 19, the mouth 106 of a shape corresponding with the passage 107 and flush with the side wall 19, and the side wall 19 arranged to bear the stream of purge gas 200 at least from the mouth 106 to the passage 107 in combination with one another improves the heat exchange between the reaction chamber 4 and the gas discharge circuit 100 by circulating the gases in contact with the fins 51g. However, the combination is optional.

Furthermore, this configuration encourages the laminar behavior of the gas flows in the chamber 4. The deposits become more homogeneous and are easier to reproduce. Furthermore, accidental reactions in the chamber 4 are reduced, especially beneath the support 5.

The proposed reactor 1 is particularly advantageous for uses employing at least two gas reagents liable to react with each other. However, the reactor 1 remains useable with a single reactive gas intended to react in contact with the substrates. In the latter case, the improvement of the laminar behavior of the stream of purge gas 200 tends to homogenize the flow of the stream of reactive gas flush with the substrates, which improves the homogeneity of the desired chemical processes and thus the quality of the products obtained. The circumferential components of the gas flows inside the chamber 4 are reduced, whether it is reactive gas, purge as or a mixture of them. Ease of reproduction is improved.

The invention claimed is:

1. A reactor device for chemical vapor deposition comprising:
 a reaction chamber having a purge gas inlet;
 a gas discharge channel connected to the reaction chamber by a circumferential opening in an inner wall of the chamber, the reaction chamber being arranged so that a stream of purge gas circulates from the purge gas inlet to the discharge channel;
 wherein the inner wall of the reaction chamber comprises means for exchanging heat with the purge gas.

2. The device according to claim 1, further comprising a substrate support plate having a peripheral surface, the plate being disposed in the reaction chamber so that at least a part of the peripheral surface of the plate is facing the heat exchange means.

3. The device according to claim 2, wherein the reaction chamber has at least one reactive gas supply facing a main surface of the plate intended to receive a substrate, a stream of reactive gas circulating in the reaction chamber from the reactive gas supply up to the discharge channel.

4. The device according to claim 1, wherein the heat exchange means comprise a plurality of fins protruding from the inner wall in the reaction chamber, the fins being arranged so as to guide the stream of purge gas toward the circumferential opening.

5. The device according to claim 4, wherein the fins are distributed regularly on the inner wall of the reaction chamber.

6. The device according to claim 4, further comprising a substrate support plate having a peripheral surface, the plate being disposed in the reaction chamber so that at least a part of the peripheral surface of the plate is facing the heat exchange means, and wherein the fins are distributed regularly around the plate.

7. The device according to claim 4, further comprising a body delimiting at least a part of the reaction chamber and at least a part attached to the body, the fins being made in the attached part.

8. The device according to claim 7, wherein the attached part is a gas discharge ring comprising an outer wall and an inner wall defining a part of the inner wall of the reaction chamber, the outer wall being connected to the inner wall by a connecting wall arranged so as to form two annular channels extending on either side of the connecting wall and between the inner and outer walls, the connecting wall comprising holes to form a fluid connection between the channels the ring being characterized in that the inner wall comprises the plurality of fins.

9. The device according to claim 4, wherein the fins extend beyond the wall by at least 1 millimeter.

10. The device according to claim 4, wherein each of the fins has a rectangular profile.

11. The device according to claim 4, wherein the distance separating two fins adjacent from each other is equal to the thickness of at least one of these fins.

12. The device according to claim 1, further comprising a substrate support having a peripheral surface, the substrate support being disposed in the reaction chamber in such a way as to form an annular passage between the peripheral surface of the substrate support and the inner wall of the reaction chamber, the purge gas inlet having an annular shape and being delimited between the inner wall of the reaction chamber and a wall of an additional part arranged in the reaction chamber.

13. A gas discharge ring for a chemical vapor deposition reactor device comprising a reaction chamber having a purge gas inlet, a gas discharge channel connected to the chamber via a circumferential opening delimited at least partly by an inner wall of the ring, the ring comprising an outer wall connected to the inner wall by a connecting wall arranged so as to form two annular channels extending on either side of the connecting wall and between the inner and outer walls, said connecting wall comprising holes to form a fluid connection between the channels, the ring being characterized in that the inner wall comprises a plurality of fins.

14. The device according to claim 3, wherein the heat exchange means comprise a plurality of fins protruding from the inner wall in the reaction chamber, the fins being arranged so as to guide the stream of purge gas toward the circumferential opening.

15. The device according to claim 6, further comprising a body delimiting at least a part of the reaction chamber and at least a part attached to the body, the fins being made in the attached part.

16. The device according to claim 7, wherein the fins extend beyond the wall by at least 1 millimeter.

17. The device according to claim 16, wherein the fins each have a rectangular profile.

18. The device according to claim 17, wherein the distance separating two fins adjacent from each other is equal to the thickness of at least one of these fins.

* * * * *

UNITED STATES PATENT AND TRADEMARK OFFICE
CERTIFICATE OF CORRECTION

PATENT NO. : 9,777,374 B2  
APPLICATION NO. : 14/769414  
DATED : October 3, 2017  
INVENTOR(S) : Patrice Nal, Christophe Borean and Julien Vitiello Page 1 of 1

It is certified that error appears in the above-identified patent and that said Letters Patent is hereby corrected as shown below:

In the Specification

| | | |
|---|---|---|
| Column 8, | Line 64, | change "lower surface Sob" to --lower surface 50b-- |
| Column 10, | Line 15, | change "lower wall 19" to --lower wall 15-- |
| Column 10, | Line 19, | change "the inner wall 15." to --the inner wall 19.-- |
| Column 13, | Line 46, | change "a gas in the absence of corresponding" to --gas in the absence of a corresponding-- |

Signed and Sealed this  
Thirtieth Day of January, 2018

Joseph Matal  
*Performing the Functions and Duties of the*  
*Under Secretary of Commerce for Intellectual Property and*  
*Director of the United States Patent and Trademark Office*